(12) United States Patent
Yee et al.

(10) Patent No.: US 8,315,070 B2
(45) Date of Patent: Nov. 20, 2012

(54) ORGANIC LIGHT EMITTING DIODE DISPLAY

(75) Inventors: Dong-Su Yee, Suwon-si (KR); Min-Su Kim, Suwon-si (KR); Chan-Kyoung Moon, Suwon-si (KR); Hyun-Hee Lee, Suwon-si (KR); Jung-Ho Hwang, Suwon-si (KR); Dai-Han Cho, Suwon-si (KR); Chan-Hee Wang, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 358 days.

(21) Appl. No.: 12/629,198

(22) Filed: Dec. 2, 2009

(65) Prior Publication Data

US 2010/0142178 A1 Jun. 10, 2010

(30) Foreign Application Priority Data

Dec. 4, 2008 (KR) .................. 10-2008-0122716

(51) Int. Cl.
*H02B 1/01* (2006.01)
(52) U.S. Cl. ...................................... 361/829

(58) Field of Classification Search ............. 361/829, 361/679.3, 679.21, 679.24, 679.55, 679.56
See application file for complete search history.

(56) References Cited

U.S. PATENT DOCUMENTS

2009/0168318 A1* 7/2009 Moon et al. .............. 361/679.21

FOREIGN PATENT DOCUMENTS

| KR | 10-0624132 | 9/2006 |
|---|---|---|
| KR | 10-2009-0076016 | 7/2009 |
| KR | 10-2009-0086738 | 8/2009 |

* cited by examiner

*Primary Examiner* — Jeremy Norris
*Assistant Examiner* — Tremesha S Willis
(74) *Attorney, Agent, or Firm* — Robert E. Bushnell, Esq.

(57) ABSTRACT

An organic light emitting diode display includes a panel assembly having a display section and a pad section, and a bezel that couples with the panel assembly. The bezel includes a back on which the panel assembly is placed, side walls located at an edge of the back of the bezel, and a protrusion reinforcing portion formed at a region corresponding to the pad section and a vicinity of the pad section in the back of the bezel.

35 Claims, 10 Drawing Sheets

ORGANIC LIGHT EMITTING DIODE DISPLAY

CROSS-REFERENCE TO RELATED APPLICATIONS

This application claims priority to and the benefit of Korean Patent Application No. 10-2008-0122716, filed in the Korean Intellectual Property Office on Dec. 4, 2008, the disclosure of which is incorporated herein by reference.

BACKGROUND OF THE INVENTION

1. Field of the Invention

Aspects of the present invention relate to an organic light emitting diode (OLED) display. More particularly, aspects of the present invention relate to a bezel that couples with a panel assembly of the organic light emitting diode display.

2. Description of the Related Art

A known organic light emitting diode display includes a panel assembly in which a second substrate serving as an encapsulation substrate is joined to a first substrate where organic light emitting elements are formed, a bezel that couples with the panel assembly at the rear of the panel assembly, and a flexible printed circuit board (FPCB) to be electrically connected to the panel assembly through a flexible circuit board. The bezel can be provided with a back on which the panel assembly is placed and side walls formed at an edge of the back.

In this organic light emitting diode display, flexural strength along the horizontal axis and flexural strength and impact resistance along the vertical axis are important characteristics for evaluating mechanical reliability of the organic light emitting diode display. Accordingly, the development of the bezel has been necessary to improve its flexural strength and impact resistance.

The information disclosed in this Background section, above, is only for enhancement of understanding of the background of the invention. Therefore, it may contain information that does not form prior art that is already known in this country to a person of ordinary skill in the art.

SUMMARY OF THE INVENTION

Aspects of the present invention provide an organic light emitting diode display that is capable of increased mechanical strength through re-forming the shape of a bezel that couples with a panel assembly.

The organic light emitting diode display according to an embodiment of the present invention includes a panel assembly having a display section and a pad section, and a bezel that couples with the panel assembly. The bezel includes a back on which the panel assembly is placed, side walls located at the edges of the back, and a protrusion reinforcing portion formed in the back at a region corresponding to the pad section and in the vicinity of the pad section.

The side walls may include a first side wall corresponding to the pad section and second side walls. The protrusion reinforcing portion may be formed in parallel with the first side wall. An open section that is located in parallel with the first side wall while exposing the side of the back may be formed in the bezel. The height of the first side wall may be lower than that of the second side walls.

The panel assembly may include the display section, a first substrate formed with the pad section, and a second substrate to be fixed to the first substrate while covering the display section. The protrusion reinforcing portion may be spaced apart from an edge of the second substrate facing the pad section toward the display section. In this case, the protrusion reinforcing portion may protrude toward the panel assembly at a distance from the first substrate or may protrude in a direction away from the panel assembly.

The organic light emitting diode display may further include a buffer plate located between the panel assembly and the bezel. The thickness of the buffer plate may be larger than the height of the protrusion reinforcing portion. The buffer plate may have an opening at a position corresponding to the protrusion reinforcing portion. The protrusion reinforcing portion may be formed in two lines at a distance from each other.

Meanwhile, the protrusion reinforcing portion may be located at a region corresponding to the pad section. In this case, the protrusion reinforcing portion may be in two sections at corners of the back. The protrusion reinforcing portion may protrude toward the panel assembly at a distance from the first substrate. The buffer plate may have a cutout accommodating the protrusion reinforcing portion. The protrusion reinforcing portion may protrude in a direction away from the panel assembly. The side walls may be folded twice or more.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
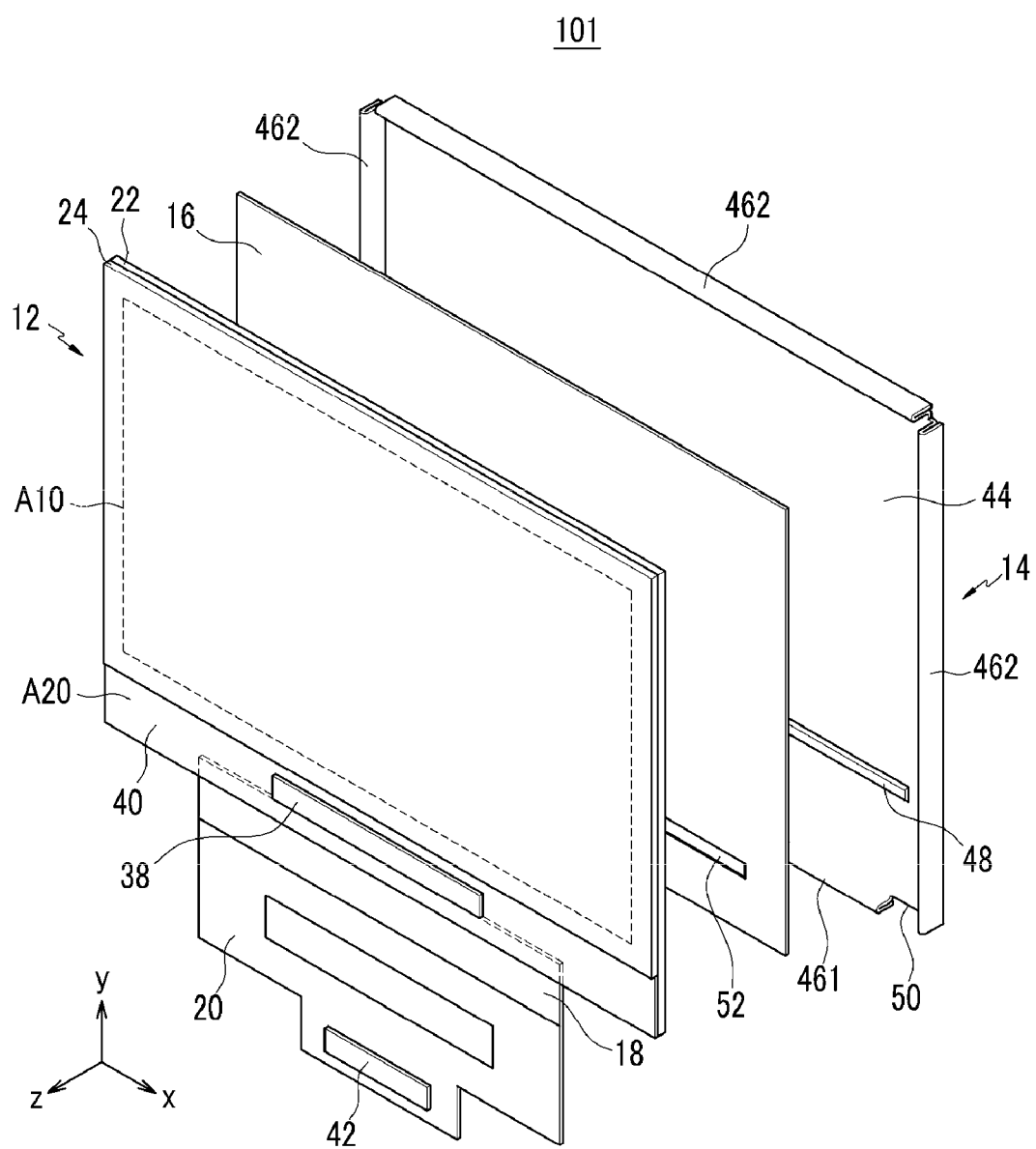
FIG. 1 is an exploded perspective view of an organic light emitting diode display according to an embodiment of the present invention.

Reference will now be made in detail to embodiments of aspects of the present invention, which are illustrated in the accompanying drawings, wherein like reference numerals refer to the like elements throughout. The embodiments are described below, in order to explain the aspects of the present invention, by referring to the figures.

Figure 2:
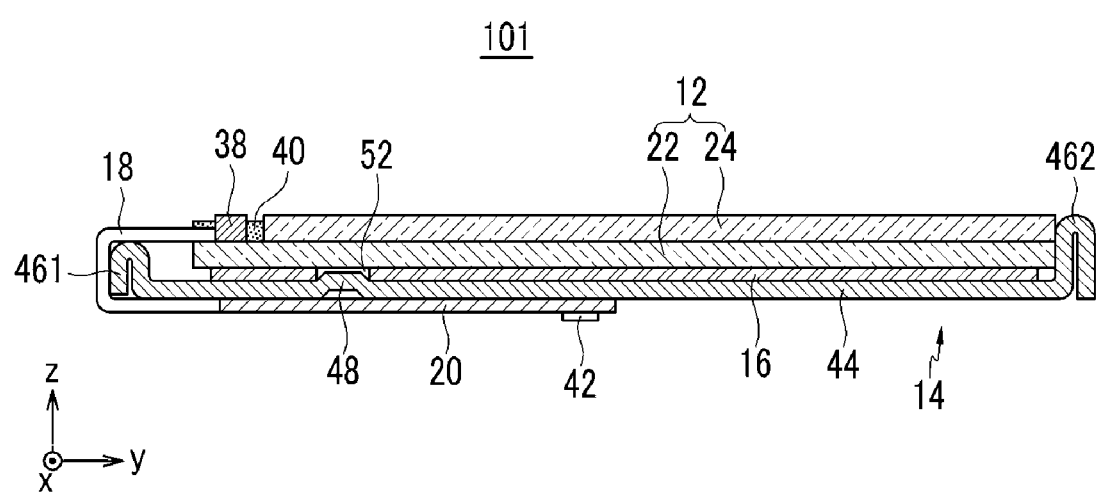
FIG. 2 is a cross-sectional view illustrating a coupled state of the organic light emitting diode display according to the embodiment of FIG. 1.

FIG. 1 is an exploded perspective view of an organic light emitting diode display according to an embodiment of the present invention, and FIG. 2 is a cross-sectional view illustrating a coupled state of the organic light emitting diode display according to the embodiment of FIG. 1. Referring to FIG. 1 and FIG. 2, an organic light emitting diode display 101 of the present embodiment includes a panel assembly 12 having a display section A10 and a pad section A20 to display a predetermined image at the display section A10, a bezel 14 that couples with the panel assembly 12 at the rear of the panel assembly 12, a buffer plate 16 located between the panel assembly 12 and the bezel 14, and a flexible printed circuit board (FPCB) 20 electrically connected to the panel assembly 12 through a flexible circuit board 18. In particular, as described below, the buffer plate 16 is a flexible material such as a sponge or a polyurethane foam.

The panel assembly 12 includes a first substrate 22 and a second substrate 24 that is smaller than the first substrate 22. An edge of the second substrate 24 is fixed to the first substrate 22 by a sealant (not shown). The display section A10 displays an actual image over regions where the first substrate 22 and the second substrate 24 overlap, toward the inside of the sealant, and the pad section A20 is located on the first substrate 22 outside of the sealant.

Sub-pixels are disposed in the form of a matrix at the first substrate 22, which serves as the display section A10, and a scan driver (not shown) and a data driver (not shown) are located between the display section A10 and the sealant, or at the outside of the sealant, to drive the sub-pixels. Pad electrodes (not shown) are located at the first substrate 22, which also serves as the pad section A20, to transmit electrical signals to the scan driver and the data driver.

Figure 3:
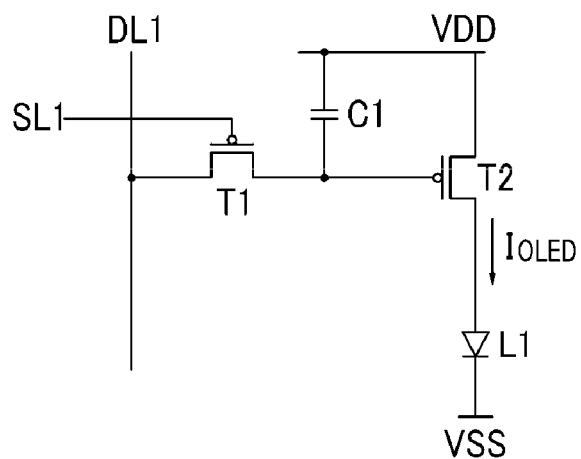
FIG. 3 is a circuit diagram of a sub-pixel in the panel assembly illustrated in FIG. 1.
Figure 4:
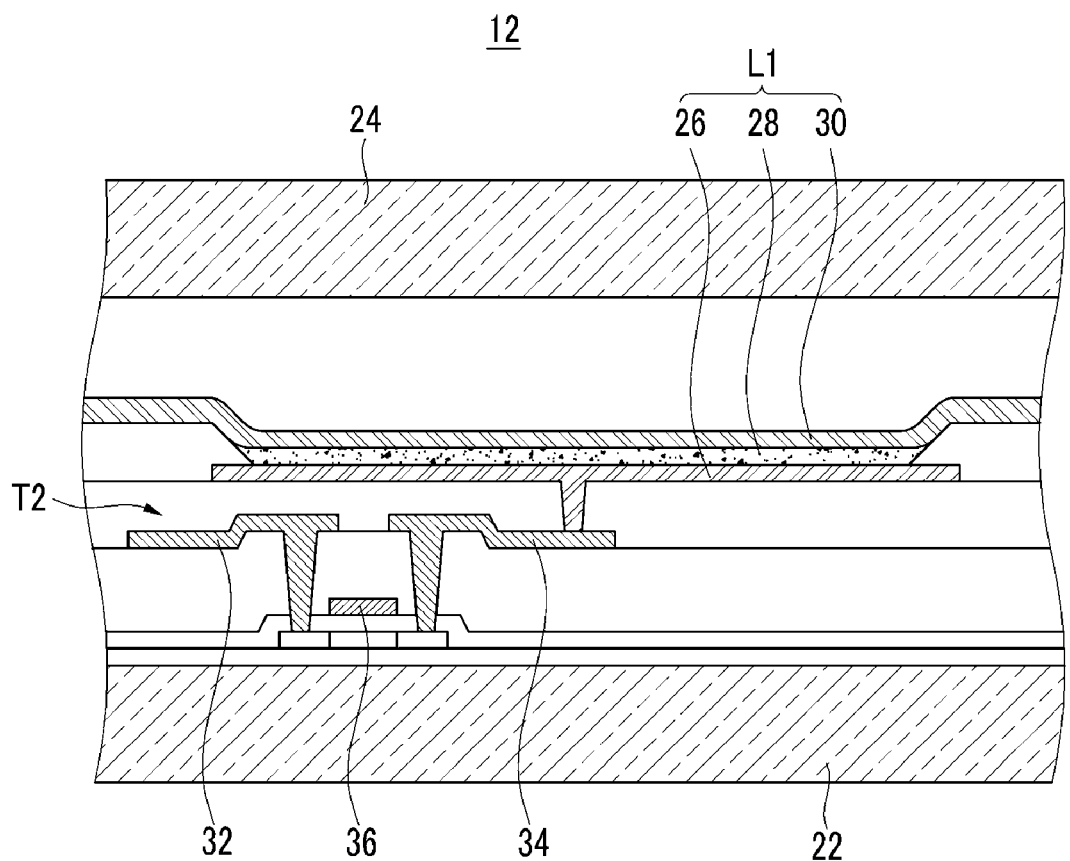
FIG. 4 is a partially enlarged cross-sectional view of the panel assembly illustrated in FIG. 1.

FIG. 3 is a circuit diagram of a sub-pixel in the panel assembly 12 illustrated in FIG. 1, and FIG. 4 is a partially enlarged cross-sectional view of the panel assembly 12 illustrated in FIG. 1. Referring to FIG. 3 and FIG. 4, the sub-pixel of the panel assembly 12 is formed by an organic light emitting element L1 and a driving circuit. The organic light emitting element L1 includes an anode electrode (hole injection electrode) 26, an organic emission layer 28, and a cathode electrode (electron injection electrode) 30, and the driving circuit includes at least two thin film transistors T1 and T2 and at least one storage capacitor C1. The thin film transistors basically include a switching transistor T1 and a driving transistor T2.

The switching transistor T1 is connected to a scan line SL1 and a data line DL1, and transmits a data voltage input from the data line DL1 to the driving transistor T2 according to a switching voltage input to the scan line SL1.

The storage capacitor C1 is connected to the switching transistor T1 and a power source line VDD, and stores a voltage that corresponds to a voltage difference between a voltage from the switching transistor T1 and a voltage from the power source line VDD.

The driving transistor T2 is connected to the power source line VDD and the storage capacitor C1, and supplies an output current $I_{OLED}$ that is about proportional to the square of the difference between the voltage stored at the storage capacitor C1 and a threshold voltage of the OLED L1. The OLED L1 emits light according to the output current $I_{OLED}$.

The driving transistor T2 includes a source electrode 32, a drain electrode 34, and a gate electrode 36, and the anode 26 of the OLED L1 may be connected to the drain electrode 34 of the driving transistor T2.

The configuration of the sub-pixel is not limited thereto, and may be modified.

Referring back to FIG. 1 and FIG. 2, the second substrate 24 is joined to the first substrate 22 by the sealant with a predetermined distance therebetween to seal the organic light emitting elements and the driving circuits formed on the first substrate 22 and to protect them from the external environment. A moisture absorption material (not shown) is attached to an inner surface of the second substrate 24, and a polarizing plate (not shown) is located at an outer surface of the second substrate 24 to block external light reflection.

Furthermore, an integrated circuit chip 38 is mounted on the pad section A20 of the panel assembly 12 in a manner such as a chip on glass (COG), and the flexible circuit board 18 is connected to the pad section A20 in a manner such as a chip on film (COF). A protective layer 40 is formed in the vicinity of the integrated circuit chip 38 and the flexible circuit board 18 to cover the pad electrodes formed on the pad section A20, thereby protecting them.

Electronic elements (not shown) are mounted on the FPCB 20 to process driving signals, and a connector 42 is provided on the FPCB 20 to transmit an external signal to the FPCB 20. The flexible circuit board 18 that is fixed to the pad section A20 is folded toward the rear of the bezel 14 so that the FPCB 20 faces the back side of the bezel 14.

Figure 5:
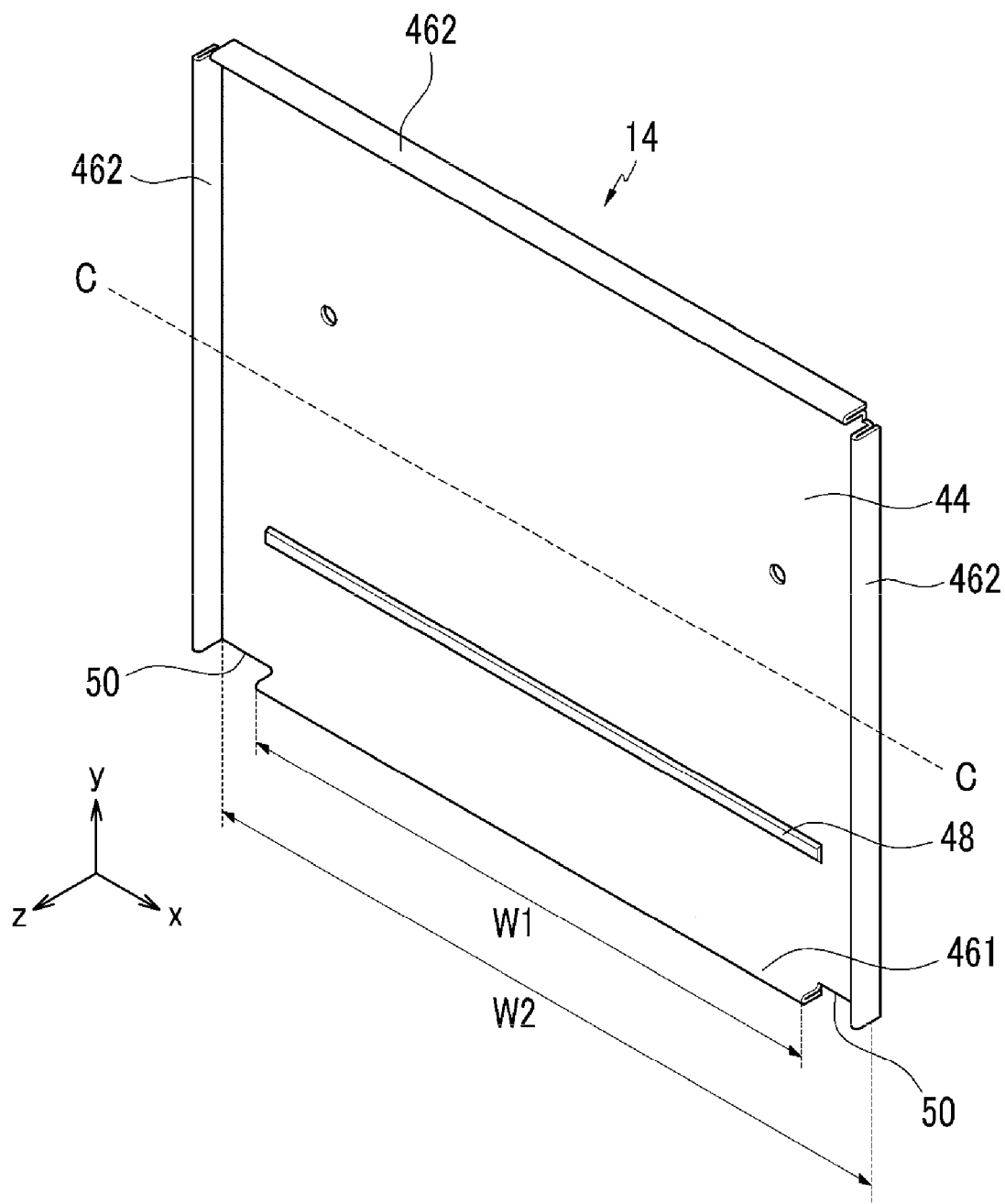
FIG. 5 is a perspective view of the bezel illustrated in FIG. 1.
Figure 6:
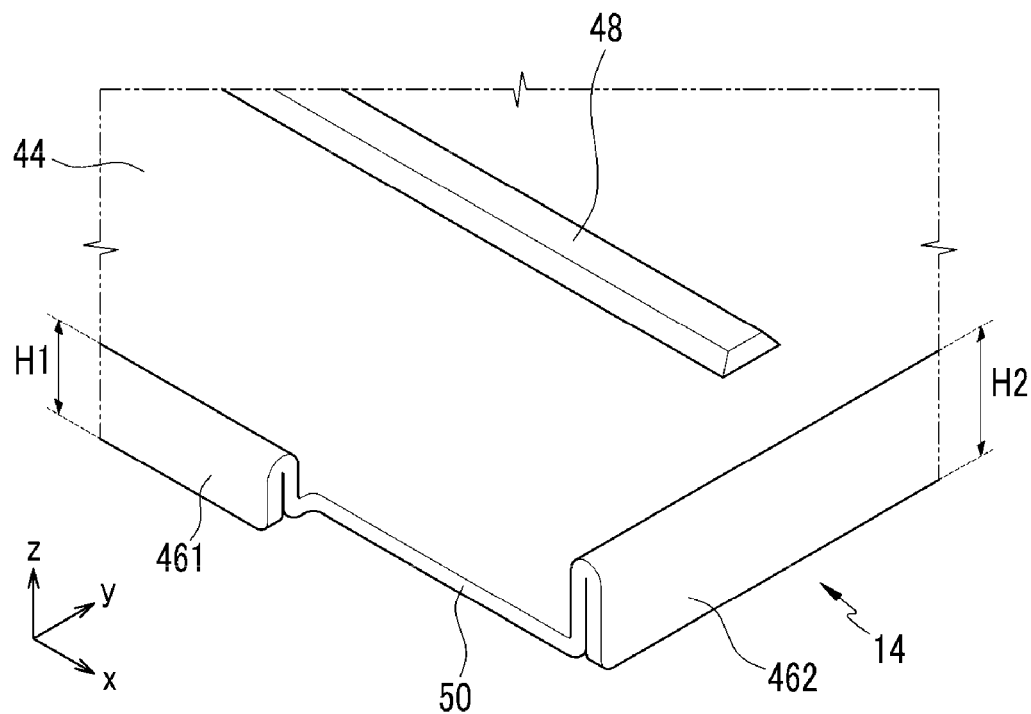
FIG. 6 is a partially enlarged view of the bezel illustrated in FIG. 5.

FIG. 5 is a perspective view of the bezel 14 illustrated in FIG. 1, and FIG. 6 is a partially enlarged view of the bezel 14 illustrated in FIG. 5. Referring to FIG. 5 and FIG. 6, the bezel 14 of the present embodiment includes a back 44 on which the panel assembly 12 is placed, side walls 461 and 462 that are extended toward the panel assembly 12 from edges of the back 44 to face the side of the panel assembly 12, and a protrusion reinforcing portion 48 that is formed at a predetermined height from the back 44 to the inside of the back 44.

The back 44 may be formed in a rectangular shape having a pair of long sides and a pair of short sides in response to the shape of the panel assembly 12. The side walls 461 and 462 are formed as layered structures of at least two layers to improve flexural strength of the bezel 14. The protrusion reinforcing portion 48 is located at a region in which rigidity is relatively weak in the bezel 14, to improve the flexural strength of the bezel 14 along with the side walls 461 and 462.

The bezel 14 is made of a metal material having high rigidity, for example, stainless steel, cold strip steel, aluminum, an aluminum alloy, and a nickel alloy. Moreover, the bezel 14 can be integrally formed with the back 44, the side walls 461 and 462, and the protrusion reinforcing portion 48 by pressing one metal plate into the appropriate shape.

The side walls 461 and 462 may be formed in such a manner that the edge of the back 44 is formed by a known hemming process to fold it at least once. As an example, FIG. 6 illustrates two-folded side walls 461 and 462 formed in such a manner that the edge is folded once toward the outside of the bezel, which is vertically oriented from the back 44. The number of folds, the folded direction of the side walls 461 and 462, and the relative lengths of the folds can be variously changed, and are not limited to the example illustrated in FIG. 6.

Because of the hemming structure in which ends of the side walls 461 and 462 are folded and stacked, the rigidity of products is improved. Therefore, the side walls 461 and 462 increase the flexural strength horizontally (x-axis direction indicated in the drawings) and the flexural strength vertically (y-axis direction indicated in the drawings) of the bezel 14, thereby improving mechanical strength of the bezel 14.

The side walls 461 and 462 include a first side wall 461 corresponding to the pad section A20 and second side walls 462. Formed in the first side wall 461 is an open section 50 at which no side wall is formed from the edge of the back 44. That is, the length of the first side wall 461 is shorter than that of the edge of the back 44 in which the first side wall 461 is located.

As examples, FIG. 5 and FIG. 6 illustrate the case where the first side wall 461 is located at the lower long side of the back 44. In this case, the width (W1, see FIG. 5) of the first side wall 461 is narrower than the width (W2, see FIG. 5) of the long side of back 44. Two open sections 50 are located at both ends of the first side wall 461. The open sections 50 of the bezel 14 are chamfered in manufacturing the bezel 14 by using a progressive mold in a way which inevitably lessens the rigidity of the region in the bezel 14 that corresponds to the pad section A20.

Moreover, the height of the first side wall 461 is lower than that of the second side wall 462. The heights of the first side wall 461 and the second side wall 462 are indicated by H1 and H2 in FIG. 6, respectively. That is because the flexible circuit board 18 can become loose in folding while surrounding the first side wall 461 and the flexible circuit board 18 then can easily be separated from the pad section A20 if the first side wall 461 has the same height as the second side wall 462. Therefore, as illustrated in FIG. 2, the first side wall 461 is formed so as to have a lower height than the second side wall 462 so that the flexible circuit board 18 can be folded but not become loose. As a result, any potential joining defect of the flexible circuit board 18 can be reduced or eliminated.

Because of the above-described open sections 50 and the lower height of the first side wall 461 in the bezel 14, a portion of the bezel 14 corresponding to the pad section A20 is less rigid. Accordingly, the protrusion reinforcing portion 48 is located in the back 44 at the region corresponding to the pad section A20 or the vicinity of the pad section A20 to increase the rigidity of that less rigid part of the bezel 14.

According to this embodiment, the protrusion reinforcing portion 48 is located at the region corresponding to the vicinity of the pad section A20. Here, the center line of the back 44 is parallel with the first side wall 461, and the vicinity of the pad section A20 represents a region between this center line and the pad section A20. The center line C is illustrated by a dotted line in FIG. 5. The center line is a virtual line dividing the back 44 in two along the y-axis direction perpendicular to the first side wall 461.

The protrusion reinforcing portion 48 is formed through a conventional press process at a predetermined height toward the inside of the bezel 14 from the back 44, and has a bar shape with a uniform width. The protrusion reinforcing portion 48 parallels the first side wall 461 and can be formed so as to be longer than the first side wall 461. The protrusion reinforcing portion 48 can also be a separate bar of similar material that is joined to the back 44 of the bezel 14.

If the protrusion reinforcing portion 48 comes in contact with the first substrate 22, exterior impact is directly transmitted to the panel assembly 12 through the protrusion reinforcing portion 48 if an exterior impact is applied to the bezel 14. For this reason, the panel assembly 12 can easily be damaged. Therefore, the protrusion reinforcing portion 48 is disposed so as to not come in contact with the first substrate 22. The buffer plate 16 having an opening 52 is located between the panel assembly 12 and the bezel 14 to prevent the protrusion reinforcing portion 48 from coming into contact with the first substrate 22.

Figure 7:
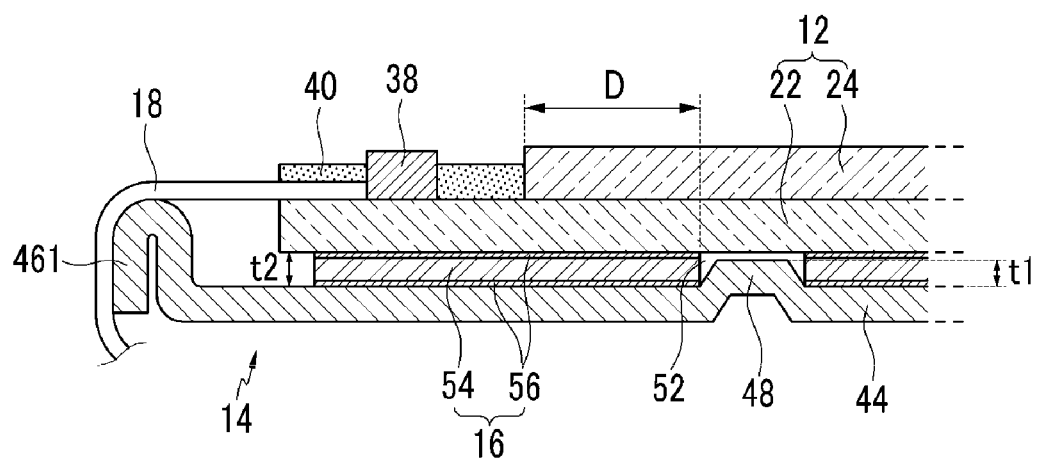
FIG. 7 is a partially enlarged view of the organic light emitting diode display illustrated in FIG. 2.

FIG. 7 is a partially enlarged view of the organic light emitting diode display illustrated in FIG. 2. Referring to FIG. 7, the buffer plate 16 is formed in the thickness t2 that is larger than the height t1 of the protrusion reinforcing portion 48, and the opening 52 is formed at a position corresponding to the protrusion reinforcing portion 48 so that the protrusion reinforcing portion 48 is located in the opening 52. The buffer plate 16 is formed of a sponge or a polyurethane foam, for example, and includes a buffer layer 54 having the buffer function and an adhesive layer 56 located at the front and rear of the buffer layer 54.

Because of the above-described structure of the buffer plate 16, since the protrusion reinforcing portion 48 does not come in contact with the first substrate 22 of the panel assembly 12, it is possible to minimize damage to the panel assembly 12. Moreover, since the buffer plate 16 absorbs the exterior impact by itself, it is possible to effectively improve impact-resistance strength such as with a drop impact. The height t1 of the protrusion reinforcing portion 48 may be approximately 0.2 mm, and the thickness t2 of the buffer plate 16 may be approximately 0.26 mm.

The protrusion reinforcing portion 48 is located at the region corresponding to a region where sections of the first substrate 22 and the second substrate 24 overlap. That is, the protrusion reinforcing portion 48 is located at a position spaced apart by a predetermined distance D from the edge of the second substrate 24 where the thickness sharply changes in the panel assembly 12, that is, where the edge of the second substrate 24 faces the pad section A20 toward the center of the back 44.

This is because the buffer plate 16 does not support the lower part of the pad section A20 of the first substrate 22 by a sufficient area, which can cause a reduction of impact-resistance strength, when the protrusion reinforcing portion 48 is located so as to correspond with the edge of the second substrate 24 or located at a region corresponding to the pad section along the thickness direction (z-axis direction indicated in the drawing) of the panel assembly 12. That is, since the area of the buffer plate 16 is reduced in the lower part of the pad section A20 of the first substrate 22, the buffer plate 16 does not function optimally in the lower part of the pad section A20.

The protrusion reinforcing portion 48 may be located at the region corresponding to the space between the edge of the second substrate 24 and the display section A10 or may be located at the region corresponding to the display section A10. In the latter case, as the distance D between the edge of the second substrate 24 and the protrusion reinforcing portion 48 increases, the protrusion reinforcing portion 48 becomes more distant from the open section 50. Accordingly, it is necessary to appropriately maintain the distance so as to not lessen the effect of reinforcing the strength of the less rigid part. Because of this protrusion reinforcing portion 48 and the buffer plate 16, the organic light emitting diode display 101 of the embodiment of FIGS. 1-7 can effectively improve the flexural strength and the impact-resistance strength.

Figure 8:
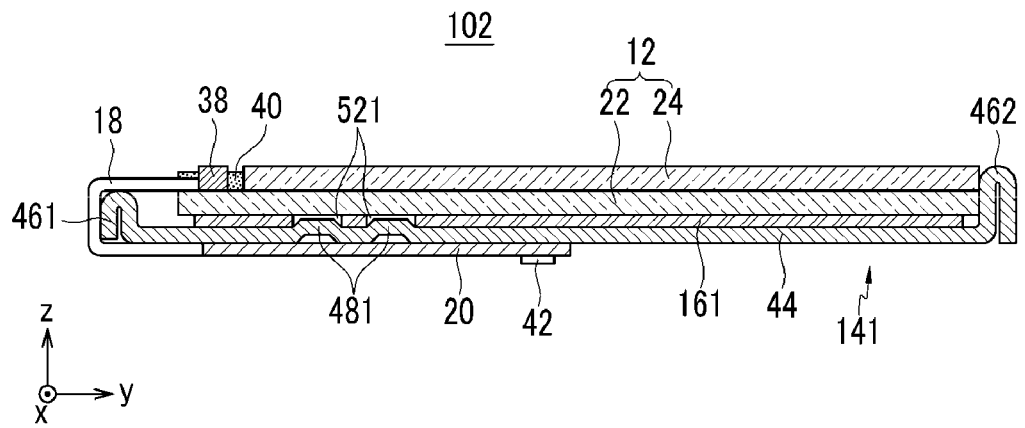
FIG. 8 is a cross-sectional view of an organic light emitting diode display according to another embodiment of the present invention.

FIG. 8 is a cross-sectional view of an organic light emitting diode display according to another embodiment of the present invention. Referring to FIG. 8, the organic light emitting diode display 102 of this embodiment has the same configuration as the organic light emitting diode display of the embodiment of FIGS. 1-7, except that a protrusion reinforcing portion 481 is provided to a bezel 141 in two lines. The same reference numerals can denote the same components as in the embodiment of FIGS. 1-7.

Two protrusion reinforcing portions 481 may have the same width and length, and a buffer plate 161 has two openings 521 corresponding to two protrusion reinforcing portions 481. The mechanical strength of the bezel 141 may be further reinforced by the two lines of the protrusion reinforcing portions 481.

Figure 9:
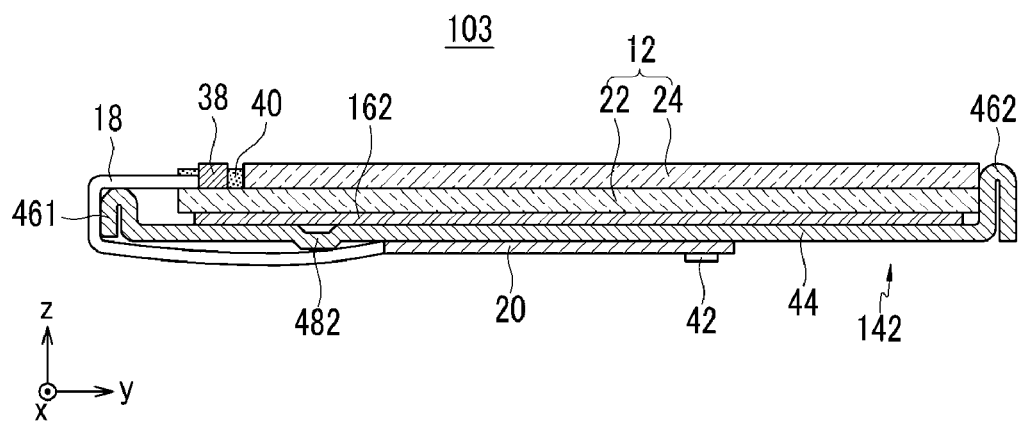
FIG. 9 is a cross-sectional view of an organic light emitting diode display according to another embodiment of the present invention.

FIG. 9 is a cross-sectional view of an organic light emitting diode display according to another embodiment of the present invention. Referring to FIG. 9, the organic light emitting diode display 103 of this embodiment has the same configuration as the organic light emitting diode display of the embodiment of FIGS. 1-7, except that a protrusion reinforcing portion 482 protrudes outwardly from the back 44 at a predetermined height, and a buffer plate 162 does not have an opening analogous to reference number 52. The same reference numerals can denote the same components as in the embodiment of FIGS. 1-7.

Since the flexible circuit board 18 and the FPCB 20 are located at the back of the back 44 of a bezel 142, the protrusion reinforcing portion 482 can be formed without particular restriction. When the FPCB 20 is formed of a flexible film, the FPCB 20 can be located at the rear of the protrusion reinforcing portion 482, but if not, the FPCB 20 can be formed to face the protrusion reinforcing portion 482 by extending the flexible circuit board 18. The latter is illustrated in the drawing.

Figure 10:
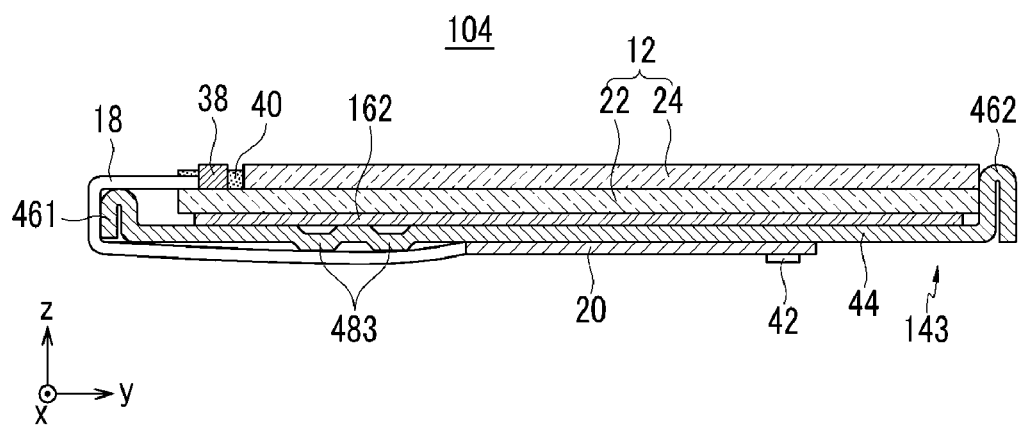
FIG. 10 is a cross-sectional view of an organic light emitting diode display according to another embodiment of the present invention.

FIG. 10 is a cross-sectional view of an organic light emitting diode display according to another embodiment of the present invention. Referring to FIG. 10, the organic light emitting diode display 104 of this embodiment has the same configuration as the organic light emitting diode display of the embodiment of FIG. 9, except that a protrusion reinforcing portion 483 is provided to a bezel 143 in two lines. The same reference numerals can denote the same components as in the third exemplary embodiment.

The above-described two protrusion reinforcing portions 483 may have the same width and length. The mechanical strength of the bezel 143 may be further reinforced by the two lines of the protrusion reinforcing portions 483.

Figure 11:
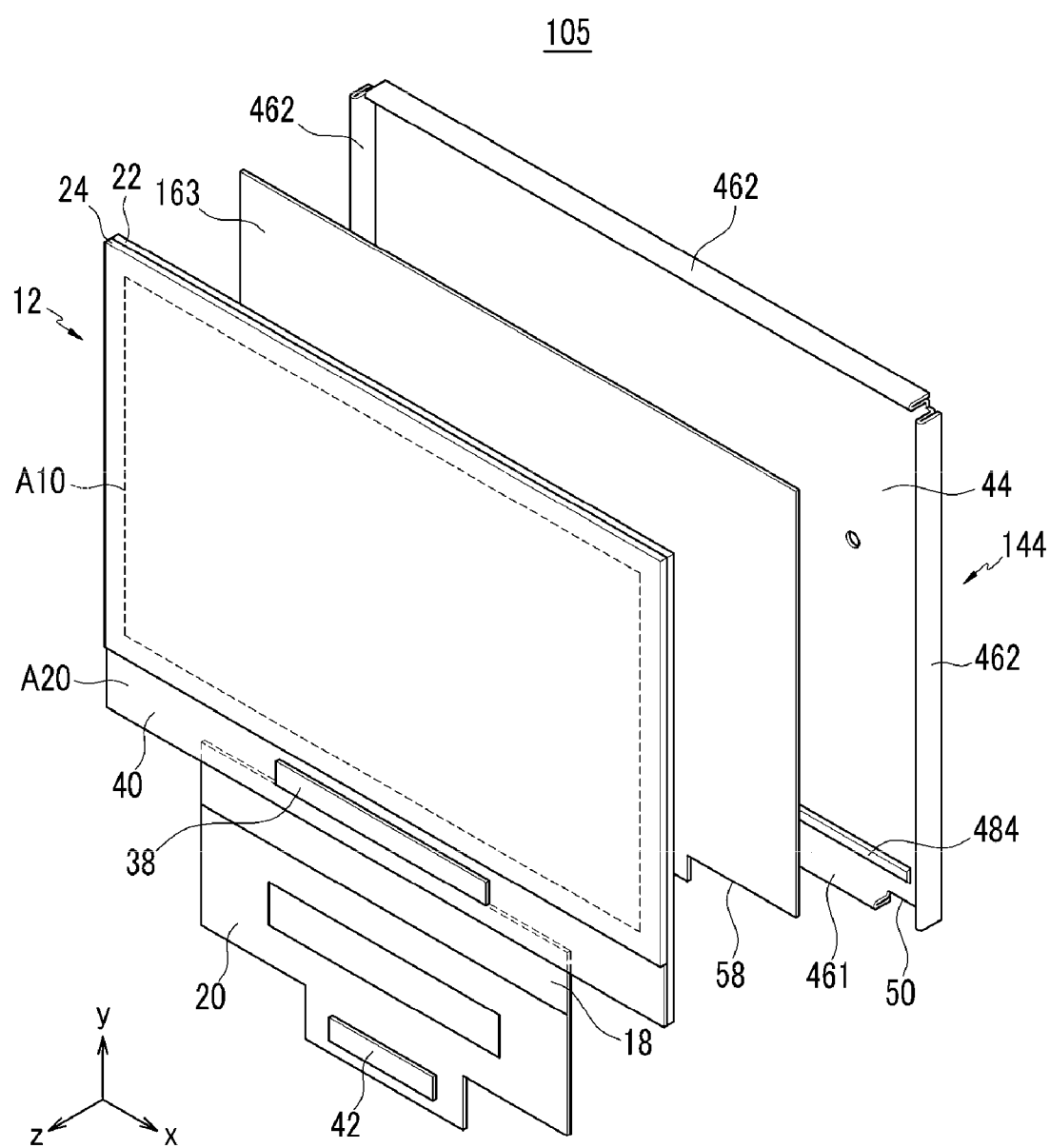
FIG. 11 is a cross-sectional view of an organic light emitting diode display according to another embodiment of the present invention.
Figure 12:
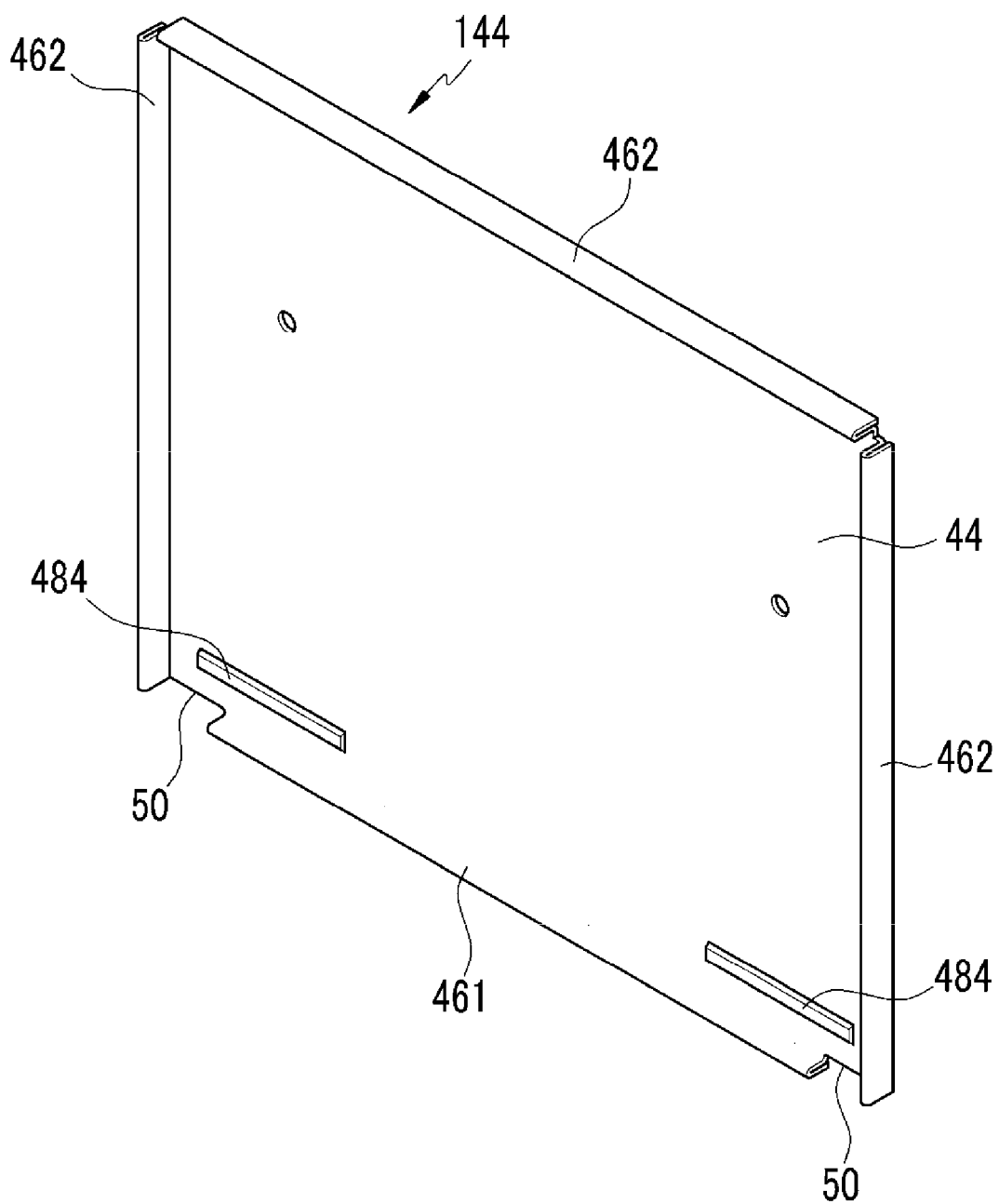
FIG. 12 is a perspective view of the bezel illustrated in FIG. 11.
Figure 13:
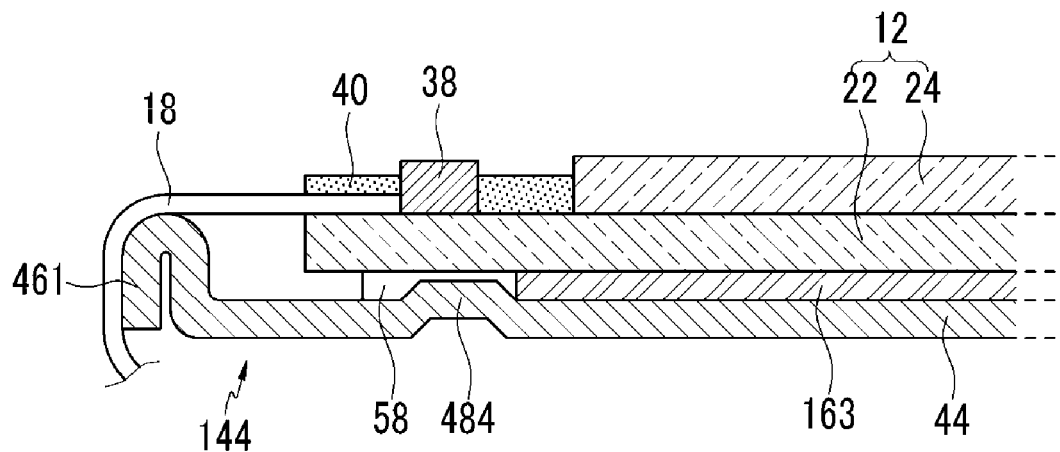
FIG. 13 is a partially enlarged cross-sectional view of the organic light emitting diode display according to the embodiment of FIG. 11.

FIG. 11 is a cross-sectional view of an organic light emitting diode display according to another embodiment of the present invention, FIG. 12 is a perspective view of the bezel illustrated in FIG. 11, and FIG. 13 is a partially enlarged cross-sectional view of the organic light emitting diode display of FIG. 11.

Referring to FIGS. 11 to 13, the organic light emitting diode display 105 of this embodiment has the same configuration as the organic light emitting diode display of FIGS. 1-7, except that two protrusion reinforcing portions 484 are disposed so as to face the open sections 50 at the region of the overlapping pad section A20, and a buffer plate 163 has two cutouts 58 accommodating the two protrusion reinforcing portions 484. The same reference numerals can denote the same components as in the embodiment of FIGS. 1-7.

The protrusion reinforcing portions 484 are located at the region corresponding to the pad section A20 in which the first substrate 22 and the second substrate 24 do not overlap with each other, and at two corners of the back 44 toward the open sections 50, respectively. The protrusion reinforcing portions 484 are formed so as to be longer than the opening sections 50 to face a portion of the first side wall 461. The buffer plate 163 has the cutouts 58 accommodating the protrusion reinforcing portions 484, instead of the openings of the embodiment of FIGS. 1-7.

As described above, since the protrusion reinforcing portions 484 are located at the vicinity of the open sections 50 where the rigidity is relatively lower in the bezel 144, it is possible to effectively improve the rigidity in the vicinity of the open sections 50. Accordingly, it is possible to minimize deformation of the bezel 144 and to minimize damage to the panel assembly 12 during any impact such as a drop.

Figure 14:
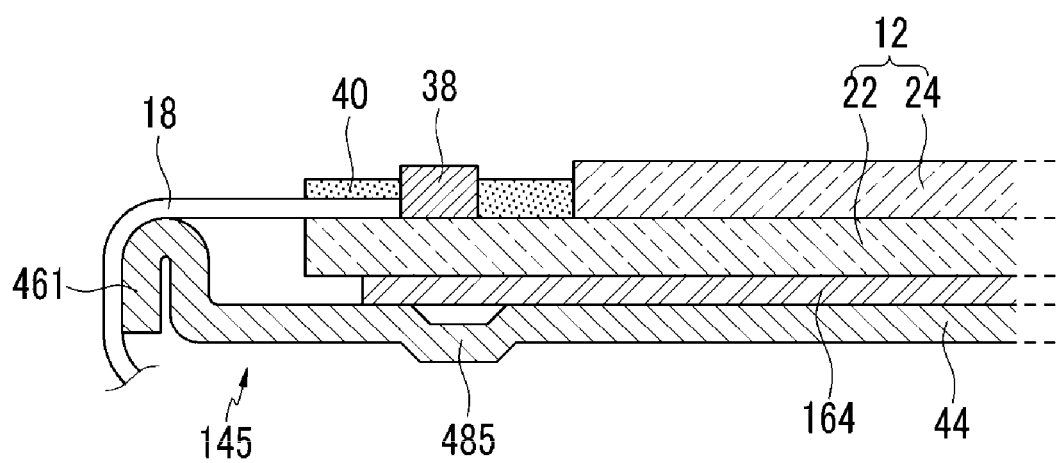
FIG. 14 is a partially enlarged cross-sectional view of an organic light emitting diode display according to another embodiment of the present invention.

FIG. 14 is a partially enlarged cross-sectional view of an organic light emitting diode display according to another embodiment of the present invention. Referring to FIG. 14, the organic light emitting diode display of this embodiment has the same configuration as the organic light emitting diode display of the embodiment of FIG. 11, except that a protrusion reinforcing portion 485 protrudes outwardly from the back 44 at a predetermined height, and a buffer plate 164 does not have the cutouts. The same reference numerals can denote the same components as in the embodiment of FIG. 11.

According to this embodiment, since the buffer plate 164 supports the entire lower part of the pad section A20 of the first substrate 22, it is possible to further improve the impact-resistance strength of the organic light emitting diode display due to the extension of the area of the buffer plate 164 while increasing the rigidity due to the protrusion reinforcing portion 485.

Figure 15:
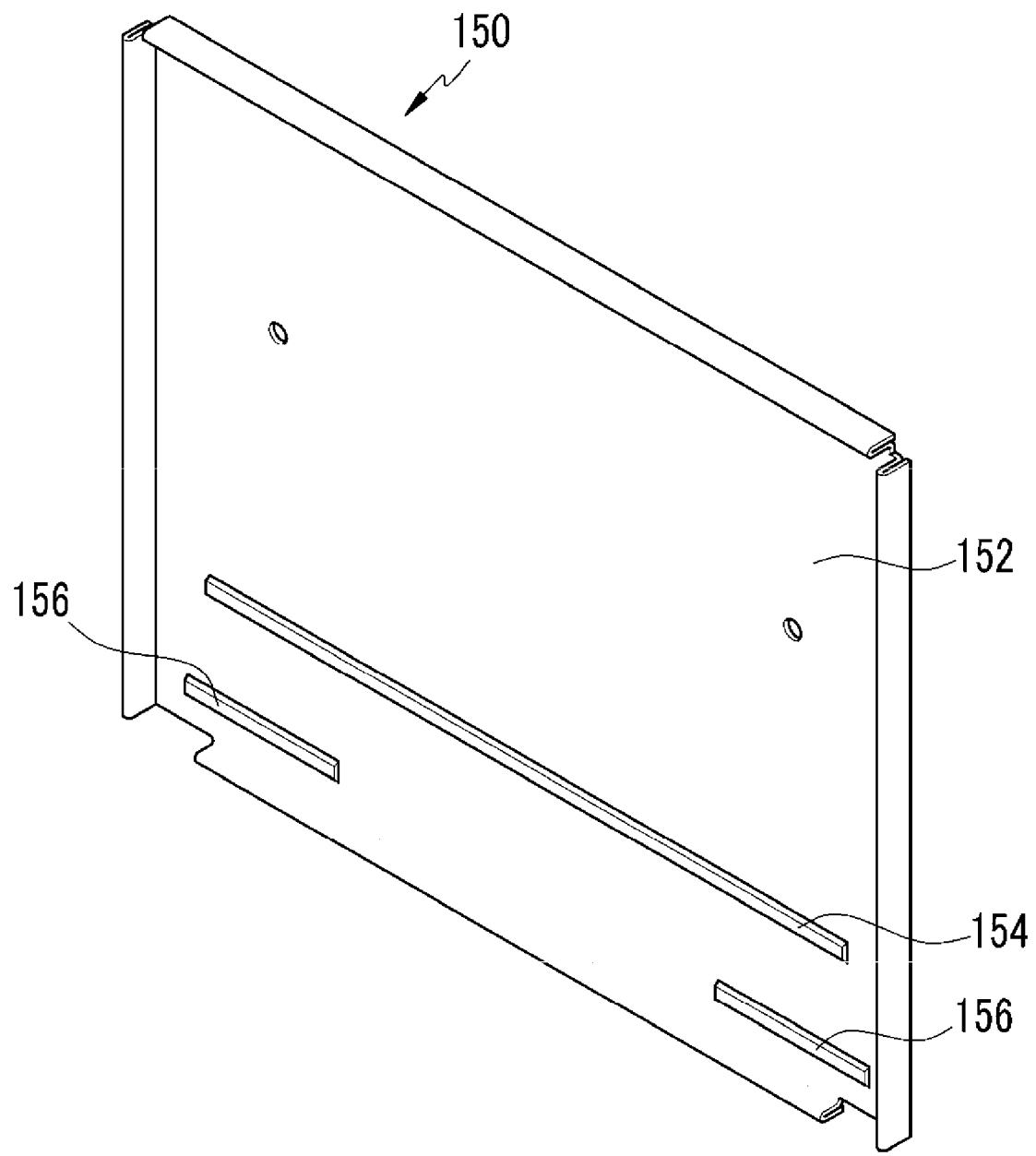
FIG. 15 is a perspective view of a bezel in an organic light emitting diode display according to another embodiment of the present invention.

FIG. 15 is a perspective view of a bezel in an organic light emitting diode display according to another embodiment of the present invention. Referring to FIG. 15, a bezel 150 of this embodiment is formed in a structure having both the protrusion reinforcing portion provided in the bezel of embodiment of FIG. 1 and the protrusion reinforcing portion provided in the bezel 144 of the embodiment of FIG. 11. That is, the bezel 150 has basically the same structure as in the above-described embodiments, and a first protrusion reinforcing portion 154 and a second protrusion reinforcing portion 156 are formed at the back 152 of the bezel 150. Here, the first protrusion reinforcing portion 154 corresponds to the protrusion reinforcing portion 48 of the embodiment of FIG. 1, and the second protrusion reinforcing portion 156 corresponds to the protrusion reinforcing portion 484 of the embodiment of FIG. 15.

According to the embodiments of the present invention, the protrusion reinforcing portion is formed at the region where the rigidity in the bezel 150 is relatively low, to improve the flexural strength and the impact-resistance strength of the bezel 150. Therefore, the organic light emitting diode display according to aspects of the present invention reduces the amount of impact to be transmitted to the panel assembly during an exterior impact such as a drop while reducing or eliminating deformation of the bezel 150 because of the exterior impact in order to minimize damage to the panel assembly.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic light emitting diode display, comprising:
a panel assembly having a display section and a pad section; and
a bezel that couples with the panel assembly, said bezel having a rectangular shape with four edges,
wherein the bezel comprises:
a back on which the panel assembly is placed,
side walls located at the edges of the back, and
a protrusion reinforcing portion formed in the back at a region corresponding to the pad section and in the vicinity of the pad section, said protrusion reinforcing portion located within and between said four edges of the bezel and a predetermined distance from said four edges of the bezel with said predetermined distance being greater than zero.

2. The organic light emitting diode display of claim 1, wherein:
the side walls include a first side wall corresponding to the pad section and second side walls, and
the protrusion reinforcing portion is formed in parallel with the first side wall.

3. The organic light emitting diode display of claim 2, wherein:
an open section that is located in parallel with the first side wall is formed in the bezel and exposes the edge of the back, and
the height of the first side wall is lower than that of the second side walls.

4. The organic light emitting diode display of claim 1, wherein:
the panel assembly includes the display section, a first substrate formed with the pad section, and a second substrate to be fixed to the first substrate while covering the display section, and
the protrusion reinforcing portion is spaced apart from an edge of the second substrate facing the pad section toward the display section.

5. The organic light emitting diode display of claim 4, wherein the protrusion reinforcing portion protrudes toward the panel assembly at a predetermined distance from the first substrate.

6. The organic light emitting diode display of claim 5, further comprising a buffer plate located between the panel assembly and the bezel, wherein the thickness of the buffer plate is larger than the height of the protrusion reinforcing portion.

7. The organic light emitting diode display of claim 6, wherein the buffer plate has an opening at a position corresponding to the protrusion reinforcing portion.

8. The organic light emitting diode display of claim 6, wherein the protrusion reinforcing portion is formed in two lines at a distance from each other.

9. The organic light emitting diode display of claim 8, wherein the buffer plate has two openings, each corresponding to the protrusion reinforcing portion formed in two lines.

10. The organic light emitting diode display of claim 4, wherein the protrusion reinforcing portion protrudes in a direction away from the panel assembly.

11. The organic light emitting diode display of claim 10, further comprising a buffer plate located between the panel assembly and the bezel.

12. The organic light emitting diode display of claim 11, wherein the protrusion reinforcing portion is formed in two lines at a distance from each other.

13. The organic light emitting diode display of claim 1, wherein:
the panel assembly includes the display section, a first substrate formed with the pad section, and a second substrate to be fixed to the first substrate while covering the display section, and
the protrusion reinforcing portion is located at a region corresponding to the pad section.

14. The organic light emitting diode display of claim 3, wherein the protrusion reinforcing portion is in two sections located at corners of the back.

15. The organic light emitting diode display of claim 14, wherein the protrusion reinforcing portion protrudes toward the panel assembly at a distance from the first substrate.

16. The organic light emitting diode display of claim 15, further comprising a buffer plate located between the panel assembly and the bezel, wherein the thickness of the buffer plate is larger than the height of the protrusion reinforcing portion.

17. The organic light emitting diode display of claim 16, wherein a cutout accommodating the protrusion reinforcing portion is formed in the buffer plate.

18. The organic light emitting diode display of claim 14, wherein the protrusion reinforcing portion protrudes in a direction away from the panel assembly.

19. The organic light emitting diode display of claim 18, further comprising a buffer plate located between the panel assembly and the bezel.

20. The organic light emitting diode display of claim 1, wherein the side walls are folded twice or more.

21. The organic light emitting diode display of claim 1, wherein the bezel is formed of a rigid metal material.

22. The organic light emitting diode display of claim 1, wherein the back, side walls and protrusion reinforcing portion of the bezel are integrally formed from one metal plate.

23. The organic light emitting diode display of claim 1, wherein the back and side walls of the bezel are integrally formed from one metal plate and the protrusion reinforcing portion is a metal bar joined to the back.

24. The organic light emitting diode display of claim 2, wherein the protrusion reinforcing portion is formed on the back below the center line of the back.

25. The organic light emitting diode display of claim 3, wherein open sections are formed at either end of the first side wall adjacent to second side walls and expose the edge of the back.

26. The organic light emitting diode display of claim 25, wherein the protrusion reinforcing portion extends over the open sections and the first side wall.

27. The organic light emitting diode display of claim 25, wherein the protrusion reinforcing portion extends over the first side wall.

28. The organic light emitting diode display of claim 25, wherein the protrusion reinforcing portion is in two sections located at corners of the back and extending over the open sections.

29. The organic light emitting diode display of claim 25, wherein the protrusion reinforcing portion is formed in two lines at a distance from each other.

30. The organic light emitting diode display of claim 29, wherein one of the lines is in two sections located at the lower corners of the back.

31. The organic light emitting diode display of claim 6, wherein the buffer plate is formed of a buffer layer and adhesive layers on both sides of the buffer layer.

32. The organic light emitting diode display of claim 31, wherein the buffer layer is formed of a flexible material.

33. The organic light emitting diode display of claim 32, wherein the flexible material is a sponge or a polyurethane foam.

34. The organic light emitting diode display of claim 10, wherein the buffer layer is continuous in the region of the protrusion reinforcing portion.

35. The organic light emitting diode display of claim 18, wherein the buffer layer is continuous in the region of the protrusion reinforcing portion.

* * * * *